United States Patent [19]
Koizumi et al.

[11] 4,362,389
[45] Dec. 7, 1982

[54] METHOD AND APPARATUS FOR PROJECTION TYPE MASK ALIGNMENT

[75] Inventors: Mituyoshi Koizumi; Nobuyuki Akiyama; Yoshimasa Oshima, all of Yokohama, Japan

[73] Assignee: Hitachi, Ltd., Tokyo, Japan

[21] Appl. No.: 122,484

[22] Filed: Feb. 19, 1980

[51] Int. Cl.³ ...................... G01B 11/27; H05K 13/00
[52] U.S. Cl. ..................................... 356/401; 356/150
[58] Field of Search ................ 356/150, 399, 400, 401

[56] References Cited

U.S. PATENT DOCUMENTS

| | | | |
|---|---|---|---|
| 3,943,359 | 3/1976 | Matsumoto et al. | 356/401 |
| 4,103,998 | 8/1978 | Nakazawa et al. | 356/401 |
| 4,153,371 | 5/1979 | Koizumi et al. | 356/401 |
| 4,170,418 | 10/1979 | Aiuchi et al. | 350/400 |

Primary Examiner—R. A. Rosenberger
Attorney, Agent, or Firm—Antonelli, Terry and Wands

[57] ABSTRACT

A mask alignment method of the projection type is disclosed which is based upon a fact that the exit pupil of a projection lens is actually positioned at a finite distance, and wherein a first wafer alignment pattern including a line segment and a second wafer alignment pattern including another line segment are formed on a wafer in those radial directions from the optical axis of a projection lens which intersect with each other approximately at a right angle. A first mask alignment pattern including a line segment and a second mask alignment pattern including another line segment are formed respectively at those positions on a mask which optically correspond to respective positions of the first and second wafer alignment patterns through the projection lens. The optical image of the first wafer alignment pattern superposed on the optical image of the first mask alignment pattern by the action of the projection lens falls on an image pickup device or element, the optical image of the second wafer alignment pattern superposed on the optical image of the second mask alignment pattern by the action of the projection lens falls on another image pickup device or element, the relative displacement between the wafer and the mask is determined by the video signals delivered from the image pickup devices or elements, and the wafer and the mask are aligned with each other so as to reduce the relative displacement to zero.

7 Claims, 17 Drawing Figures

METHOD AND APPARATUS FOR PROJECTION TYPE MASK ALIGNMENT

BACKGROUND OF THE INVENTION

The present invention relates to a method and an apparatus for projection type mask alignment, and more particularly to a method and an apparatus for reduction-projection type mask alignment.

Figures 1A, 1B, 1C:
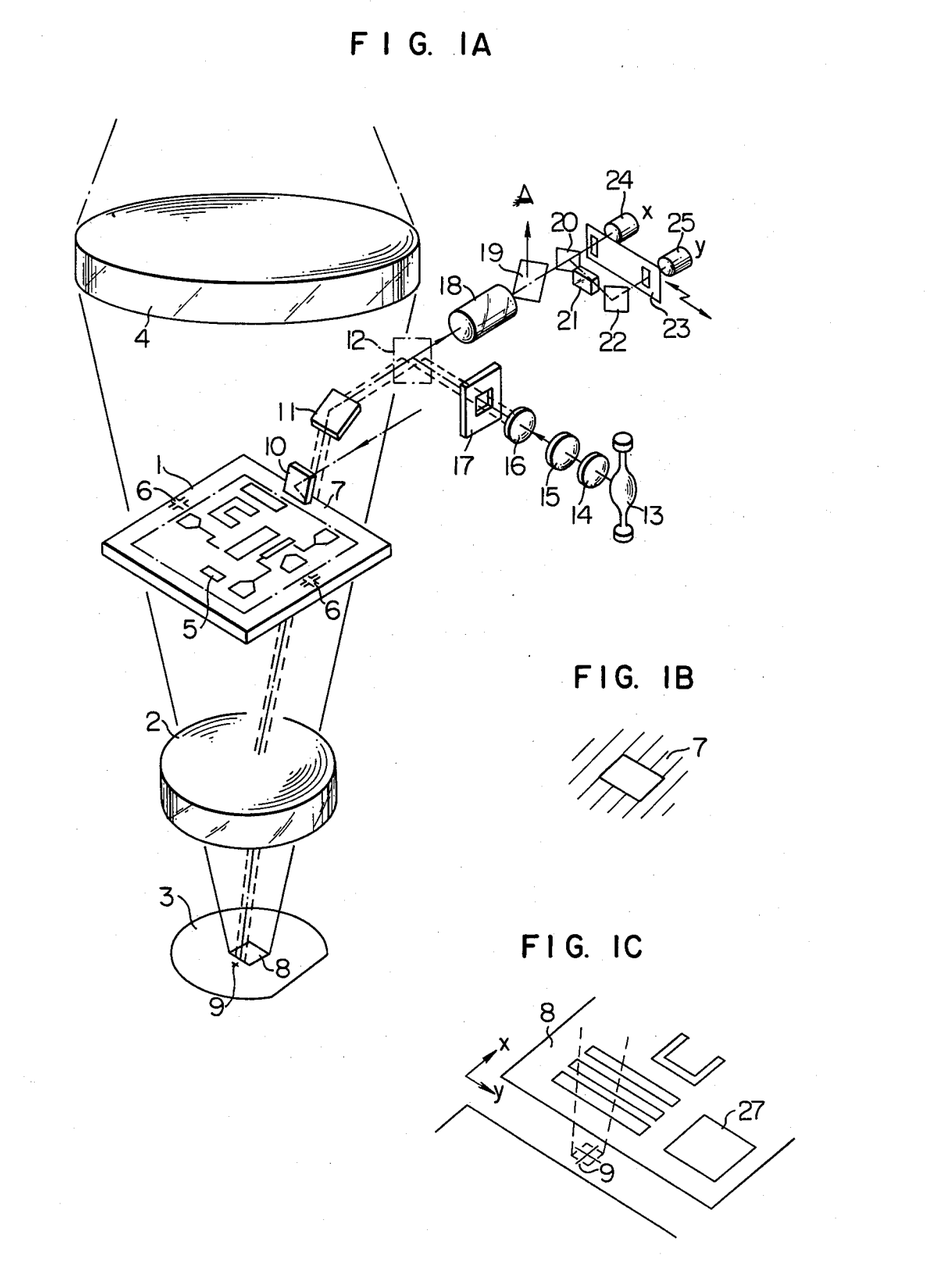
FIG. 1A is a perspective view showing a structure of a conventional mask alignment apparatus of reduction-projection type.
FIG. 1B is an enlarged view of the mask alignment pattern shown in FIG. 1A.
FIG. 1C is a perspective view for showing a wafer alignment pattern formed on each chip of the wafer shown in FIG. 1A, together with the optical image of the mask alignment pattern.

A conventional exposure apparatus of reduction-projection type has such a structure as disclosed in U.S. Pat. No. 4,153,371. That is, in the conventional exposure apparatus, as is shown in FIGS. 1A, 1B and 1C of the accompanying drawings, a mask 1 is disposed at a distance from a wafer 3 with a projection lens 2 placed therebetween, and a condenser lens 4 is disposed above the mask 1. The mask 1 is illuminated by an exposure light emitted from an exposure light source (not shown) through the condenser lens 4, and a mask pattern 5 formed on the mask 1 is projected through the projection lens 2 onto the chips 8 of the wafer 3 in the form of a reduced image 27. At that time, in order to align the mask 1 with the directions of step and repeat movement of a wafer-feeding table for carrying the wafer 3 and to place the mask 1 on the origin of an absolute coordinate, a relative displacement between a mark (or a cross-shaped alignment pattern) formed in a microscope (not shown) for positioning the mask 1 and an alignment pattern 6 formed on the mask 1 and having the shape of  is detected automatically or by naked eyes on the X and Y axes of the absolute coordinate which are coincident with the directions of movement of the wafer-feeding table for carrying the wafer 3, and then an X-axis feed table, a Y-axis feed table and a rotary table, all of which are used to carry the mask 1, are subjected respectively to a fine displacement in the direction of X axis, a fine displacement in the direction of Y axis and an angular displacement $\theta$, in accordance with the above relative displacement.

In the above-mentioned exposure apparatus of projection type, according to a conventional mask alignment apparatus of projection type for aligning the mask 1 and the wafer 3 with each other, a chromium film is deposited on the surface of the peripheral portion of the mask 1 by evaporation technique to form a mask alignment pattern 7 including a transparent portion having a size of about 400 $\mu$m×400 $\mu$m. On the other hand, a wafer alignment pattern comprised of a cross-shaped groove having a width of about 5 $\mu$m is formed in the surface of the wafer 3 which is coated with a photoresist film. Further, the mask alignment apparatus is equipped with a first and a second optical system and a detection system. The first optical system is made up of a mercury lamp 13 emitting the same light as the exposure light, an interference filter 14, condenser lenses 15 and 16, a field diaphragm 17, a semi-transparent mirror 12, and a reflection mirror 11. The second optical system includes a reflection mirror 10, and illuminates the mask alignment pattern 7 in a direction different from that of the first optical system. The detection system includes an objective lens 18, semi-transparent mirrors 19 and 20, an image rotating prism 21, a reflection mirror 22, a plate provided with a slit 23, and light-detecting elements 24 and 25.

Figure 2A:
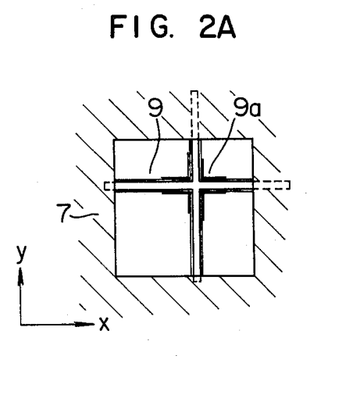
FIG. 2A shows optical images of the mask and wafer alignment patterns formed on the slit plane shown in FIG. 1A, together with the scanning slit.
Figures 2B, 3, 4:
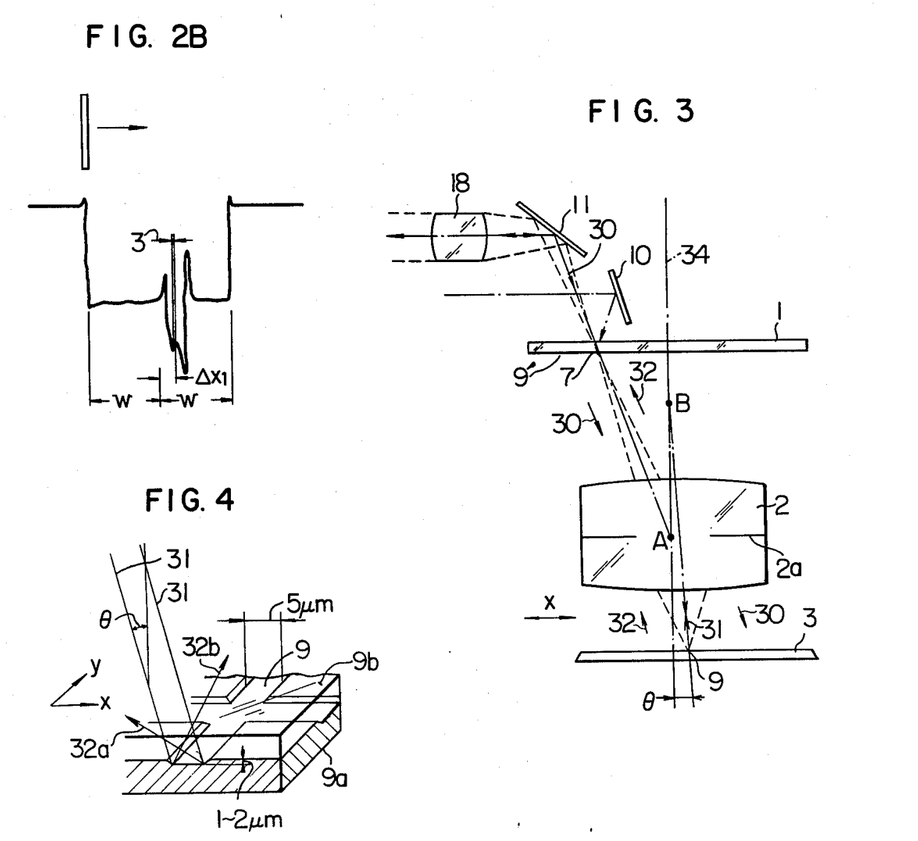
FIG. 2B shows the waveform of the video signal detected from the optical images shown in FIG. 2A by the light-detecting element for displacement in the direction of X axis.
FIG. 3 shows the optical path of the illumination light in the apparatus shown in FIG. 1A.
FIG. 4 shows the optical path of the light reflected from the wafer alignment pattern formed in each chip of the wafer shown in FIG. 1A.
Figure 2C:
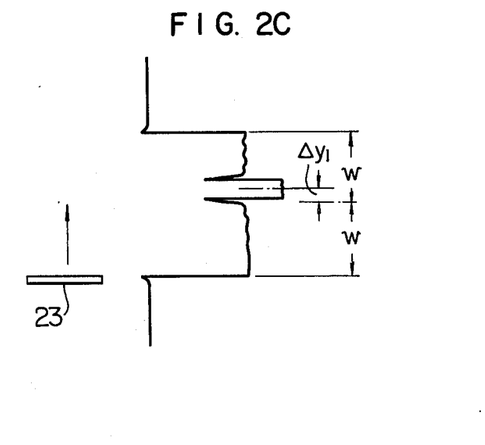
FIG. 2C shows the form of the video signal detected from the optical images shown in FIG. 2A by the light-detecting element for displacement in the direction of Y axis.

As is known in the prior art, the wafer 3 is mounted previously on a cassette jig (not shown) in another station, and is subjected to a coarse alignment. The cassette jig is placed on the wafer-feeding table (not shown) which is driven by a step and repeat operation, in such a manner as to be put in contact with positioning pins provided on the wafer-feeding table. The wafer-feeding table is moved in a positive direction along the X axis, for example, by a distance equal to N×P, in order to place the leftmost chip 8 of the wafer 3 on the optical axis passing the center of the reduction-projection lens 2, where N represents the number of chips and P a pitch of chips, namely a length of a unit step. The light emitted from the mercury lamp 13, which has the same wavelength components as the exposure light, illuminates the mask alignment pattern 7 on the mask 1 through the interference filter 14, the condenser lenses 15 and 16, the field diaphragm 17, the semi-transparent mirror 12 and the reflection mirror 11. The light having passed through the mask alignment pattern 7 travels toward the center A of the entrance pupil of the projection lens 2 as the incident light. The light having passed through the reduction-projection lens 2 travels toward the wafer alignment pattern 9 on the chip 8 from the center B of the exit pupil of the reduction-projection lens 2, and forms a reduced optical image 7' of the mask alignment pattern 7 on the wafer alignment pattern 9. The reflected light from the wafer alignment pattern 9 passes through the reduction-projection lens 2, and therefore the patterns 7 and 9 are again projected onto the surface of the mask 1. The reflected light having passed through the transparent portion of the mask alignment pattern 7 travels toward the slit 23 through the reflection mirror 11, the semi-transparent mirror 12, the objective lens 18, the semi-transparent mirrors 19 and 20, the image rotating prism 21 and the reflection mirror 22 to form on the slit plane such an optical image having an interference fringe as shown in FIG. 2A. The optical image of the alignment patterns 7 and 9 as shown in FIG. 2A is converted by the light-detecting elements 24 and 25 into such signals as shown in FIGS. 2B and 2C, when the slit 23 is subjected to reciprocating motion. The relative displacement $\Delta x_1$ in the direction of X axis between the patterns 7 and 9 and the relative displacement $\Delta y_1$ in the direction of Y axis between the patterns 7 and 9 are detected from the signals shown in FIGS. 2B and 2C, and then stored into a memory. In more detail, the detection of the relative displacement $\Delta x_1$ and $\Delta y_1$ is made in the following manner. As shown in FIGS. 2A, 2B and 2C, the region of the mask 1 surrounding the transparent portion has a bright level since the surrounding region is illuminated with the second optical system including the reflection mirror 10. At the same time, the reflected light from the wafer 3 has a weak intensity, and therefore the transparent portion has a less bright level, so that the position of the transparent portion of the mask alignment pattern 7 is determined from a pair of clear boundaries between the transparent portion and the region surrounding the transparent portion, and the relative displacement $\Delta x_1$ and $\Delta y_1$ are determined by the position of the transparent portion and the center of the wafer alignment pattern 9.

Next, the wafer-feeding table which is driven by step and repeat operation, is moved in a negative direction along the X axis, for example, by a distance of 2N×P, to position the rightmost chip 8 of the wafer 3 on the optical axis. Then, the light emitted from the mercury lamp 13 and having the same wavelength components as the exposure light is directed to the mask alignment pattern 7 and the wafer alignment pattern 9 to form the optical images of the patterns 7 and 9 on the slit plane by the reflected light from the wafer 3. In a similar manner to that above-mentioned, the relative displacement $\Delta x_2$ in the direction of X axis between the patterns 7 and 9 and the relative displacement $\Delta y_2$ in the direction of Y axis between the patterns 7 and 9 are detected on the basis of the signals which are delivered from the light detecting elements 24 and 25 when the slit plane is subjected to reciprocating motion, and the detected displacement $\Delta x_2$ and $\Delta y_2$ are stored into a memory.

Next, the wafer-feeding table carrying the wafer 3 is slightly rotated by an angle $\theta$ which is equal tp $(\Delta y_1 - \Delta y_2)/2N \times P$, to make the directions in which chips 8 have already been arranged in the wafer 3 respectively coincide with the directions of X and Y axes which are equal to the directions of step and repeat movement. With respect to the direction of Y axis, the mask-feeding table carrying the mask 1 is moved in the direction of Y axis by a distance equal to $\Delta y_1$ (or $\Delta y_2$). Further, with respect to the direction of X axis, the mask-feeding table is moved in the direction of X axis by a distance equal to $\Delta x_1$ (or $\Delta x_2$). Thus, the mask 1 and the wafer 3 are aligned with each other.

After the alignment between the mask 1 and the wafer 3 has been achieved in the above manner, the wafer-feeding table which is driven by step and repeat operation, is moved by a length equal to P in the directions of X and Y axes, and the wafer 3 is illuminated by the exposure light every time, the wafer-feeding table is moved in the above directions. Thus, a large number of chips which are arranged on the wafer 3 in the form of a checkerboard, can be exposed and printed.

The illumination light travels along such an optical path as shown in FIG. 3, and is reflected from the wafer 3 as shown in FIG. 4. In more detail, the illumination light 30 having passed through the objective lens 18 is reflected from the mirror 11, passes through the transparent portion of the mask alignment pattern 7, and then travels toward the center A of the entrance pupil of the projection lens 2. The illumination light 31 having passed through the lens 2 travels in the direction from the center B of the exit pupil of the lens 2 to the wafer 3, and the wafer 3 is illuminated by the light 31. In the present optical design technique, it is impossible to make the incident angle $\theta$ of the illumination light 31 equal to zero. The illumination light 31 is reflected from the wafer alignment pattern 9 in such a manner as shown in FIG. 4. In more detail, the wafer alignment pattern 9 having the form of a cross is made up of a cross-shaped groove formed in the surface of the silicon substrate 9a and having a depth of 1 to 2 $\mu$m, and a photoresist film 9b coated on the surface of the substrate 9a. When those steps on both sides of the groove which are formed along the direction of Y axis, are illuminated by the light 31, the reflected light 32a from one of the steps and the reflected light 32b from the other step travel in respective directions which are different from each other and asymmetrical with respect to the plane which is defined by the optical axis of the projection lens 34 and the light 31. Both the reflected light 32a and the reflected light 32b pass through the projection lens 2, and form an reflected image 9' of the wafer alignment pattern 9 on the surface of the mask 1. However, all of each of the reflected light 32a and the reflected light 32b do not enter into the projectionlens 2, but only a part of each light 32a or 32b passes through a diaphragm 2a in the lens 2, and serves to form the reflected image 9'. The reflected light 32a and the reflected light 32b are greatly different in quantity of light capable of passing through the projection lens 2 from each other, and therefore the signal obtained from the light-detecting element by the reciprocating motion of the slit plane has such an asymmetric form as shown in FIG. 2B. As a result, it is different to detect the center of the wafer alignment pattern in the direction of X axis, with high accuracy, and therefore it is impossible to align the wafer with the mask with high accuracy in the direction of X axis.

SUMMARY OF THE INVENTION

A main object of the present invention is to provide a method and an apparatus for projection-type mask alignment in which a mask and a wafer may be precisely aligned to each other with high accuracy by the use of a projection lens whose exit pupil is spaced apart from the lens at a finite distance.

In order to attain the above object, in a mask alignment method according to the present invention which is based upon a fact that the exit pupil of a projection lens is actually positioned at a finite distance from the lens, a first wafer alignment pattern including a line segment and a second wafer alignment pattern including another line segment are formed within a projection region of a projection lens on a wafer in those radial directions from the optical axis of the projection lens which intersect with each other at a right angle, that is, the extension line of the center line of the first wafer alignment patten and that of the second wafer alignment pattern intersect with each other at a right angle on the optical axis of the projection lens. Further, a first mask alignment pattern including a line segment and a second mask alignment pattern including another line segment are formed respectively at those positions on a mask which optically correspond to respective positions of the first and second wafer alignment patterns through the projection lens. The optical image of the first wafer alignment pattern superposed on the optical image of the first mask alignment pattern by the action of the projection lens falls on an image pickup device, and the optical image of the second wafer alignment pattern superposed on the optical image of the second mask alignment pattern by the action of the projection lens falls on another image pickup device. The relative displacement in the directions of X and Y axes between the wafer and the mask is determined by the video signal delivered from each of the image pickup devices, and the wafer and the mask are aligned with each other so as to reduce the relative displacement to zero. Further, a feature of the present invention resides in a mask alignment apparatus of projection type for realizing the above mask alignment method.

DESCRIPTION OF THE PREFERRED EMBODIMENT

Figure 5:
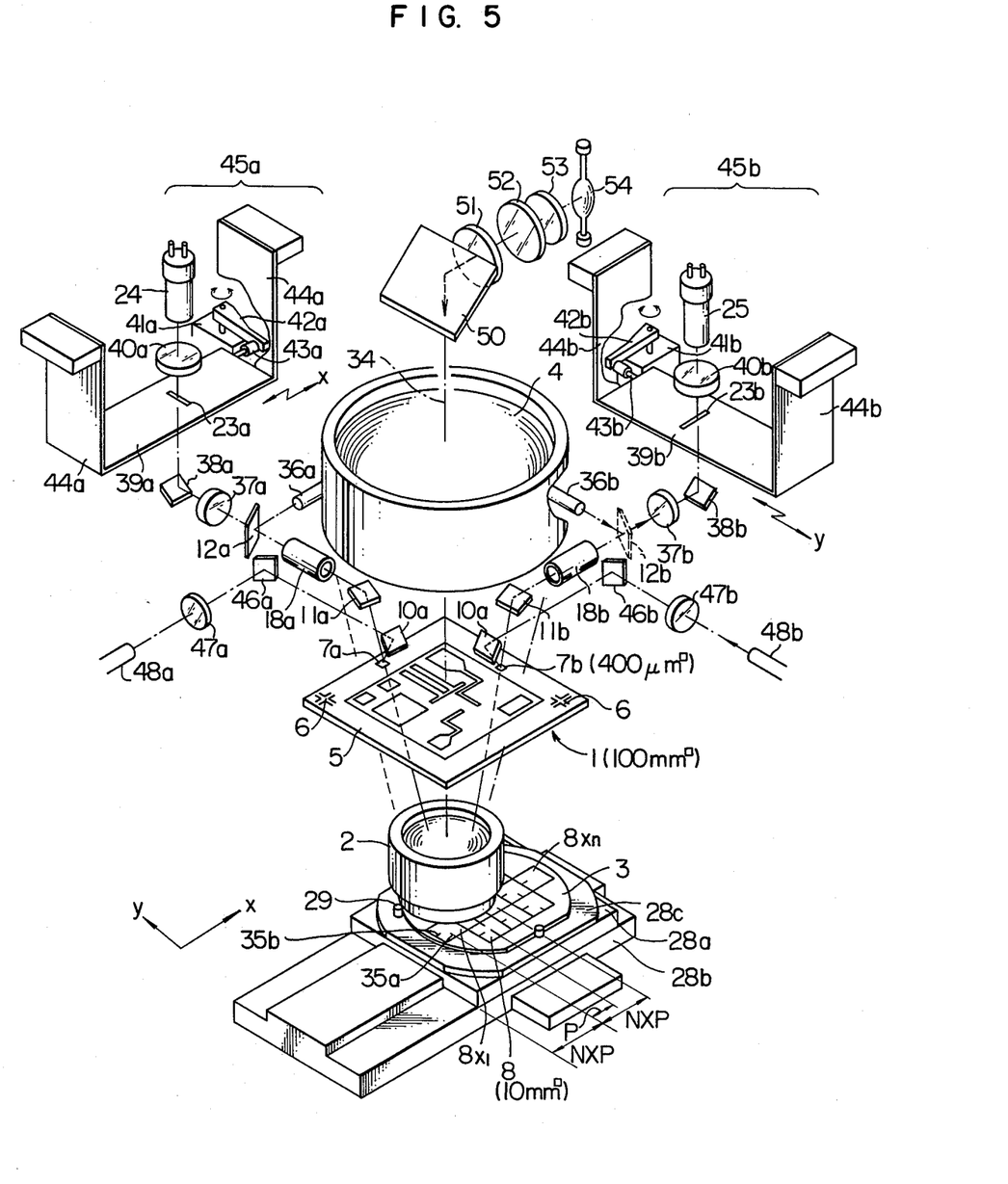
FIG. 5 is a perspective view showing an embodiment of a mask alignment apparatus of reduction-projection type according to the present invention.
Figure 6:
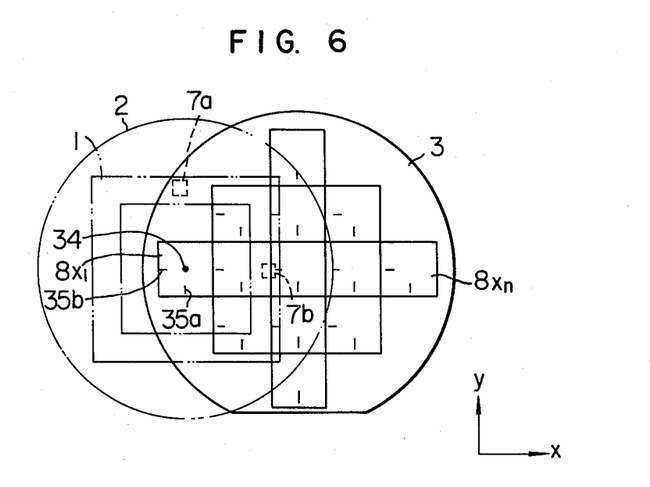
FIG. 6 is a view for showing the mask and wafer alignment patterns in a state that the mask shown in FIG. 5, the reduction-projection lens shown in FIG. 5, and the leftmost chip of the wafer shown in FIG. 5 overlap each other.

FIG. 5 shows the construction of an embodiment of a mask alignment apparatus of reduction-projection type which is usable in realizing a mask alignment method according to the present invention. In a different station, the wafer 3 is mounted on a cassette jig (not shown) having a precisely-finished side face and is subjected to a coarse alignment. The cassette jig carrying the wafer 3 is placed on a wafer-feeding table 28 in such a manner as being kept in contact with and fixed by positioning pins 29 fixed to the upper surface of the wafer-feeding table 28. Thus, the wafer 3 is coarsely aligned. The wafer-feeding table 28 includes an X-axis feed table 28a, a Y-axis feed table 28b and a rotary (or θ) table 28c. The tables 28a and 28b conduct the step and repeat movement. A large number of chips are arranged on the wafer 3 in the form of a checkerboard. As is shown in FIGS. 5 and 6, a rectilinear wafer alignment pattern 35b is formed on the leftmost part of each chip 8 in the direction parallel to the X axis and passing the optical axis 34 of the reduction-projection lens 2 (or the center of each chip), and another rectilinear wafer alignment pattern 35a is formed on the lowermost part of each chip 8 in the direction parallel to the Y axis and passing the optical axis 34. The mask 1 includes therein an integrated circuit pattern 5, transparent windows each having the form of a square for aligning the mask 1 with the wafer 3, namely, mask alignment patterns 7b and 7a formed respectively on the rightmost part of the mask 1 in the direction parallel to the X axis and passing the optical axis 34 of the reduction-projection lens 2 and the uppermost part of the mask 1 in the direction parallel to the Y axis and passing the optical axis 34, and a pair of alignment marks 6 formed in two corners of the mask 1 for positioning the mask 1 with respect to the absolute coordinate (or reference coordinate) which corresponds to the directions of step and repeat movement of the mask-feeding table. The mask 1 having the above patterns and marks is mounted on a mask-feeding table which is provided with a through hole at the central portion thereof. The alignment marks 6 are observed by means of a pair of microscopes (not shown). The relative displacement between each alignment mark and the mark (showing the absolute coordinate) formed in each microscope is detected by optical detectors or naked eyes and the mask-feeding table carrying the mask 1 is moved automatically or manually so as to reduce the relative displacement to zero. Thus, the mask 1 is positioned with respect to the absolute coordinate with high accuracy. In more detail, the positioning of the mask 1 is conducted with very high accuracy with respect to the directions of step and repeat movement of the X-axis and Y-axis feed tables 28a and 28b (namely, the directions of X and Y axes) and with respect to the reference position (namely, the origin of the coordinate).

Next, explanation will be made on the alignment of the wafer 3 with the mask 1, namely, the alignment of the wafer 3 with the absolute coordinate (or reference coordinate). Referring to FIG. 5, there are provided two detection systems 45a and 45b, which correspond to the alignment patterns 7a and 35a and the alignment patterns 7b and 35b, respectively. The detection system 45a (or 45b) is made up of an optical fiber 48a (or 48b) for guiding the light which illuminates the mask alignment pattern 7a (or 7b), a condenser lens 47a (or 47b), a reflection mirror 10a (or 10b), an optical fiber 36a (or 36b) for guiding the light which is emitted from a mercury lamp and has the same wavelength components as the exposure light, a semi-transparent mirror 12a (or 12b), an objective lens 18a (or 18b), a reflection mirror 11a (or 11b), a lens 37a (or 37b), a reflection mirror 38a (or 38b), a condenser lens 40a (or 40b), a light-detecting element 24 (or 25) such as a photomultiplier, a scanning plate 39a (or 39b) provided with a slit 23a (or 23b) and conducting the reciprocating motion, a flat spring 44a (or 44b) for supporting the scanning plate 39a (or 39b), a galvanometer 41a (or 41b) conducting the rotational vibration, a lever 42a (or 42b) fixed to the output shaft of the galvanometer 41a (or 41b), and a pin 43a (or 43b) which is fixed to one end of the lever 42a (or 42b) and is kept in contact with the scanning plate 39a (or 39b).

Figure 8:
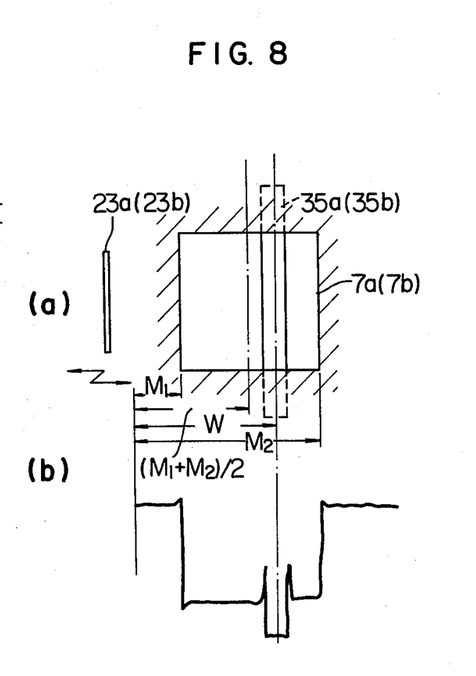
FIG. 8(a) shows that the optical images shown in FIG. 7 is scanned by the slit.
FIG. 8(b) shows the waveform of the video signal delivered from each of the light-detecting elements shown in FIG. 5.

The exposure portion of the embodiment shown in FIG. 5 is made up of a light source 54 such as a mercury lamp, a filter 53, condenser lenses 52 and 51, a reflection mirror 50, and a condenser lens 4. Further, a pair of optical systems are employed to illuminate only the mask alignment patterns 7a and 7b. In more detail, the optical system for illuminating the pattern 7a (or 7b) includes the optical fiber 48a (or 48b), the condenser lens 47a (or 47b), the reflection mirror 46a (or 46b), and the reflection mirror 10a (or 10b). That portion of mask alignment pattern 7a (or 7b) which surrounds the transparent window, is illuminated with the light from the above optical system, and therefore is put in a high level in the signal delivered from the light-detecting element 24 of the detection system 45a (or the light-detecting element 25 of the detection system 45b), as shown in FIG. 8(b). Accordingly, the distance $M_1$ between a reference position and one edge of the window and the distance $M_2$ between the reference position and the other edge of the window can be determined with high accuracy. Further, the light for illuminating the wafer alignment pattern 35a (or 35b) is directed to the center A of the entrance pupil of the reduction-projection lens 2 by means of the optical fiber 36a (or 36b), the semi-transparent mirror 12a (or 12b), the objective lens 18a (or 18b), and the reflection mirror 11a (or 11b). The illumination light thus directed impinges upon and is reflected from the wafer alignment pattern 35a (or 35b). The reflected light travels in the reverse direction on the optical path of the incident light, and then reaches the slit 23a (or 23b) through the lens 37a (or 37b) and the reflection mirror 38a (or 38b). The focus of the objective lens 18a (or 18b) is placed upon the mask alignment pattern 7a (or 7b), and respective optical images of the alignment patterns 7a and 35a (or 7b and 35b) are formed on the plane containing the slit 23a (or 23b). Further, the light guided by each of the optical fibers 36a, 36b, 48a and 48b has the same wavelength components as the exposure light, and therefore the focus of the reduction-projection lens can be prevented from becoming vague due to chromatic aberration.

Figure 7:
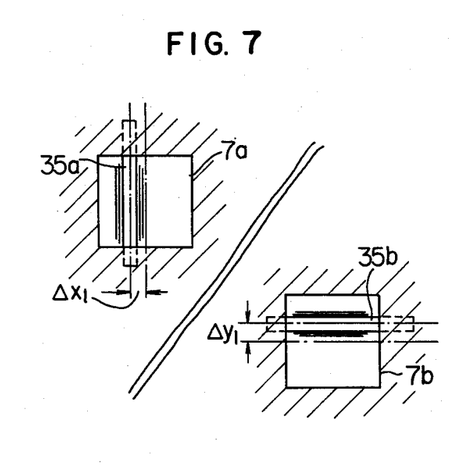
FIG. 7 shows optical images formed at respective slit portions of the scanning plates shown in FIG. 5.

The embodiment shown in FIG. 5 is operated as follows. At first, the X-axis feed table 28a is moved to the right from the origin of the coordinate (which is placed on the optical axis 34 of the reduction-projection lens 2) by a length of N×P in accordance with a command from a control unit (not shown), where N indicates the number of chips and P a pitch of chips. The above operation is similar to that in the case where the integrated circuit pattern is first printed. The length, which is equal to N×P, is determined with high accuracy by the use of a measuring instrument employing laser light. When the X-axis feed table 28a has been moved as above, a chip $8x_1$, is placed upon the optical axis 34. At that time, the optical image of the rectilinear wafer alignment pattern 35a of the chip $8x_1$, and the optical image of the mask alignment pattern 7a are combined with each other, as shown in FIG. 7. Similarly, the optical image of the pattern 35b of the chip $8x_1$, and the optical image of the pattern 7b are, as shown in FIG. 7, combined with each other. Since the rectilinear wafer alignment patterns 35a and 35b are placed on the straight lines which are radially extended from the center of the chip (which is placed on the optical axis 34), the light reflected from one of the facing steps of the rectilinear pattern 35a or 35b and the light reflected from the other of the facing steps travel symmetrically with respect to the plane defined by the optical axis 34 of the projection lens 2 and the incident light beam, even if the illumination light impinges upon the wafer alignment pattern in the direction from the center B of the exit pupil which is placed at a finite distance, to the wafer alignment pattern, namely, in the direction producing an incident angle $\theta$. Thus, the light reflected from one of the facing steps of the wafer alignment pattern and the light reflected from the other step are equal in quantity of light to each other when they pass through the projection lens 2, and therefore it is possible to obtain such a symmetrical signal as shown in FIG. 8(b). Accordingly, the relative displacement $\Delta x_1$ in the direction of X axis between the mask 1 and the chip $8x_1$ can be determined with high accuracy by detecting the optical images of the alignment patterns 7a and 35a by the light-detecting element 24 through the slit 23a conducting the reciprocating motion. The mask alignment pattern 7b is placed at the position which is obtained by rotating the position of the pattern 7a round the optical axis 34 by an angle of 90°, and the wafer alignment pattern 35b is placed at the position obtained by rotating the position of the pattern 35a round the optical axis 34 by an angle of 90°. Like the relative displacement $\Delta x_1$, the relative displacement $\Delta y_1$ in the direction of Y axis between the mask 1 and the chip $8x_1$ is obtained with high accuracy by detecting the optical images of the alignment patterns 7b and 35b by the light-detecting element 25 through the slit 23b conducting the reciprocating motion.

Next, the illumination of the alignment patterns with the illumination light is stopped, and then the X-axis feed table 28a is moved to the left by a length of 2N×P in accordance with a command from the control unit (not shown). The above length is determined with high accuracy by the use of the measuring instrument employing laser light. Then, a chip $8x_n$ is placed on the optical axis 34. At that time, as is shown in FIG. 7, the optical image of the rectinear wafer alignment pattern 35a of the chip $8x_n$ and the optical image of the mask alignment pattern 7a are combined with each other, and the optical image of the rectilinear wafer alignment pattern 35b of the chip $8x_n$ and the optical image of the mask alignment pattern 7b are combined with each other. In a similar manner to the previously-mentioned, the alignment patterns are illuminated with the illumination light, and the optical images of the alignment patterns are detected by the detectors 45a and 45b. Thus, the relative displacement $\Delta x_2$ in the direction of X axis between the mask 1 and the chip $8x_n$ and the relative displacement $\Delta y_2$ in the direction of Y axis are obtained with high accuracy.

An angle $\theta$ equal to $(\Delta y_2 - \Delta y_1)/2NP$ indicates an angular displacement of the wafer 3 in the rotational direction. The rotary table 28c carrying the wafer 3 is rotated so as to make the angle $\theta$ equal to zero, and thus the relative displacement in the rotational direction between the mask 1 and the wafer 3 is reduced to zero. Next, the reference control signal stored in a control circuit for causing the X-axis feed table 28a and the Y-axis feed table 28b to conduct the step and repeat movement is corrected so as to eliminate the error $\Delta x_1$ (or $\Delta x_2$) in the direction of X axis and the error $\Delta y_1$ (or $\Delta y_2$) in the direction of Y axis. Then, the wafer 3 can conduct the step and repeat movement while being aligned with the mask 1. Since the wafer 3 is subjected to such chemical treatment as diffusion, expansion and contraction are generated in the wafer 3. In order to solve this problem, chips $8y_1$ and $8y_n$ which are arranged in the direction of Y axis, are further examined in the previously-mentioned manner, and the relative displacement $(\Delta x_3, \Delta y_3)$ with respect to the chip $8y_1$ and the relative displacement $(\Delta x_4, \Delta y_4)$ with respect to the chip $8y_n$ are determined. The pitch P of the step and repeat movement is corrected on the basis of the expansion and contraction $(\Delta x_2 - \Delta x_1)$ of the wafer 3 in the direction of X axis and the expansion and contraction $(\Delta y_4 - \Delta y_3)$ in the direction of Y axis. Then, the mask 1 and the wafer 3 can be aligned with each other with high accuracy.

Figure 9:
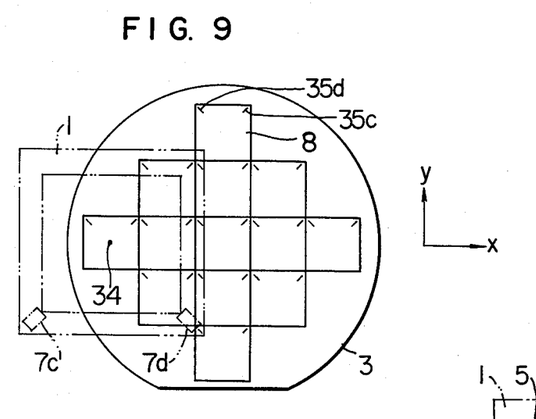
FIG. 9 shows mask and wafer alignment patterns, which are formed at other positions than the positions of the mask and wafer alignment patterns shown in FIG. 6.

Referring to FIG. 9, rectilinear wafer alignment patterns 35c and 35d are formed in two corners of each chip 8 of the wafer 3 in such a manner that the extension line of the center line of the pattern 35c and that of the pattern 35d intersect at a right angle at the center of the chip. Further, mask alignment patterns 7c and 7d, each of which includes a transparent window having the form of a square, are formed in two corners of the mask 1. The mask and wafer having the alignment patterns 35c, 35d, 7c and 7d can produce the same effect as the embodiment shown in FIGS. 5 and 6. In this case, however, the relative displacement in the directions of X and Y axes cannot be determined directly, but the relative displacement directly detected has to be converted into an X component and a Y component.

Figure 10:
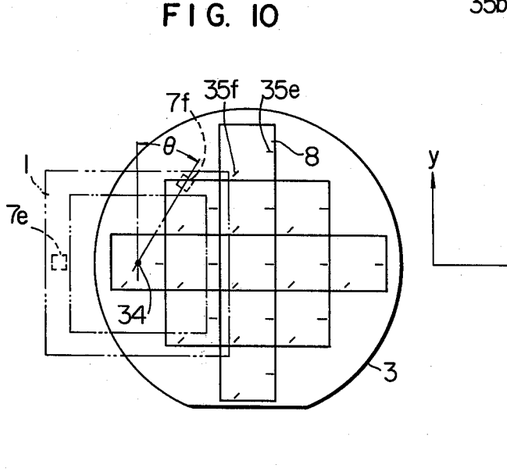
FIG. 10 shows mask and wafer alignment patterns, which are formed at other positions than the positions of the mask and wafer alignment patterns shown in FIGS. 6 and 9.

In the foregoing embodiments, a pair of rectilinear wafer alignment patterns are formed on each chip 8 of the wafer 3 in such a manner that respective center lines of the patterns intersect at a right angle at the center of the chip. However, it is not always required that the patterns intersect at a right angle. Referring to FIG. 10, rectilinear wafer alignment patterns 35e and 35f may be arranged radially from the center of each chip with an angle of 90°±θ° made therebetween, through the accuracy in alignment may be reduced to some extent. In this case, mask alignment patterns 7e and 7f are formed at those positions on the mask 1 which correspond to the wafer alignment patterns 35e and 35f, respectively. In a case where the angle θ is greater than 45°, for example, the accuracy, with which the relative displacement in the direction of X axis is detected, is decreased. For this reason, it is preferable to make the angle θ less than 30°.

Figure 11A:
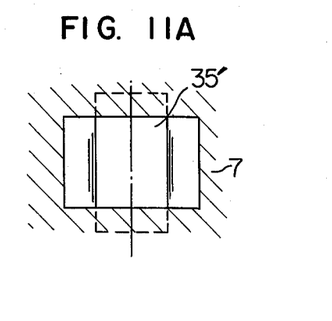
FIGS. 11A and 11B show mask and wafer alignment patterns, which differ in shape from those shown in FIGS. 7 and 8.
Figure 11B:
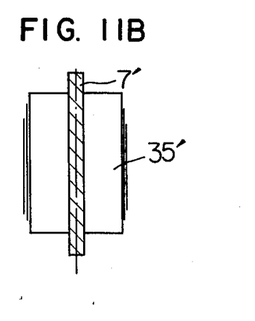

In the foregoing embodiments, the rectilinear alignment patterns are formed on the wafer 3, and the square alignment patterns are formed on the mask 1. However, as shown in FIG. 11A, square alignment patterns 35' may be formed on the wafer 3. Further, as shown in FIG. 11B, rectilinear alignment patterns 7' may be formed on the mask 1. In either case, however, the respective center lines of the wafer alignment patterns have to be directed to the center of the chip.

Figure 12:
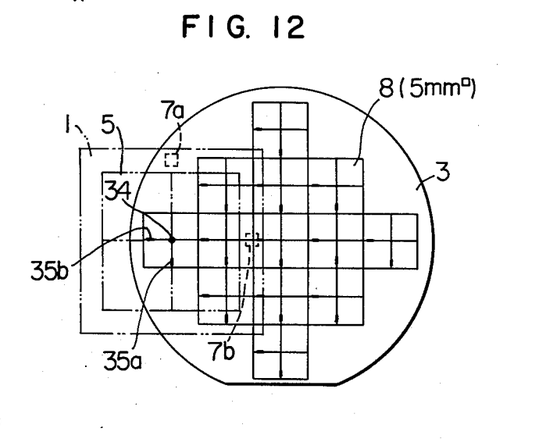
FIG. 12 shows a case where four chips each having a size of 5 mm×5 mm are printed by a single exposure.

In the foregoing description, explanation has been made on cases where one of the chips 8 each having a size of 10 mm×10 mm is printed by a single exposure. However, it is also possible that a circuit pattern corresponding to four chips is formed on the mask 1 and four chips each having a size of 5 mm×5 mm are printed by a single exposure. In this case, the rectilinear wafer alignment patterns 35a and 35b may be formed at every four chips in such a manner as being directed to the center of four chips, and the mask alignment patterns 7a and 7b each having the form of a square may be formed on the mask 1 in such a manner as being arranged radially with respect to the optical axis 34. It is not necessary for the wafer alignment patterns 35a and 35b to be formed on each chip.

In the foregoing embodiments, a pair of detection units are employed. However, the scanning plate, the flat spring, the drive mechanism for conducting the reciprocating motion, and so forth can be commonly used, when an image rotator is employed.

Further, a self-scanning type image pickup element (or a linear image sensor) may be employed as the detection unit.

In the foregoing description, explanation has been made on the alignment method in which a reduction-projection lens is employed. However, a projection lens having a reduction ratio of 1/1 also produces the same phenomena as the reduction-projection lens, since it is impossible to place the exit pupil of the lens having a reduction ratio of 1/1 at the infinite point. Accordingly, the present invention is applicable to an alignment method in which a projection lens having a reduction ratio of 1/1 is employed.

As has been explained hereinbefore, according to the present invention, the light reflected from a wafer alignment pattern is prevented from having an asymmetric intensity distribution, which is produced due to the fact that the direction from the exit pupil of a reduction-projection lens to the wafer alignment pattern is not perpendicular to the surface of the wafer. As a result, the relative displacement in the directions of X and Y axes between a mask and the wafer can be detected with high accuracy. That is, a relative displacement less than 0.1 μm can be detected with the present invention when a mask and a wafer are aligned with each other. While, the relative displacement detectable with prior art lies within a range of 0.5 to 1 μm.

We claim:

1. A mask alignment method of projection type comprising the steps of:
    disposing a wafer in a region onto which a mask is projected by a projection lens, said wafer including first and second wafer alignment patterns formed thereon, said first wafer alignment pattern having at least a first line segment, said first line segment being formed at a first position on said wafer and having a predetermined length in a first direction with first and second step edges extending parallel to one another along said predetermined length, said second wafer alignment pattern having at least another first line segment, said another first line segment being formed at a second position different than said first position on said wafer and having a predetermined length in a second direction approximately perpendicular to said first direction with said first and second step edges extending parallel to one another along said predetermined length, said first and second wafer alignment patterns having respective pattern center axes, said pattern center axes being approximately parallel to said first and second line segments, respectively, said first and second positions being determined so as to cause directions along which each of said pattern center axes lies to intersect with the optical axis of said projection lens;
    projecting first and second mask alignment patterns of said mask onto said first and second wafer alignment patterns, respectively, said first and second mask alignment patterns being laid respectively upon said first and second wafer alignment patterns when said mask is projected onto said wafer by said projection lens, each of said first and second mask alignment patterns including at least a second line segment having a predetermined length, said first and second mask alignment patterns being formed at such positions on said mask as to make each of said second line segments parallel to a corresponding one of said first line segments when said mask is correctly aligned with said wafer; and
    aligning said mask and said wafer with each other by the use of optical images of said first and second wafer alignment patterns and said first and second mask alignment patterns, said optical images being formed and converted into video signals, a relative displacement between each of said first line segments and a corresponding one of said second line segments being determined by a video signal corresponding to said first line segment and a video signal corresponding to said second line segment, said relative displacement being reduced to align said wafer with said mask, wherein, during the course of said adjusting, equal amounts of said projected light will be reflected off the first and second step edges of each of said first and second wafer alignment patterns due to the positional relationship of the longitudinal center axes of the first and second wafer alignment patterns to the optical axis of the projection lens.

2. A method for alignment of a wafer with a mask using light-projection through a projection lens, said wafer including a plurality of exposure sections, each including predetermined circuit patterns, said method comprising the steps of:

preliminarily forming on each of said exposure sections of said wafer at least first and second wafer alignment patterns each including at least one longitudinal mark at the periphery of the circuit patterns included therein, each said longitudinal mark including first and second step edges extending parallel to one another along the length of said longitudinal mark, and forming on the mask first and second mask alignment patterns, said first and second wafer alignment patterns and said first and second mask alignment patterns being formed in such a positional relationship that when said wafer is disposed at a predetermined region in the path of the light projection, longitudinal center axes of said first and second wafer alignment patterns extend substantially towards the optical axis of said projection lens, and that when said wafer is positioned in alignment with said mask, longitudinal center axes of optical images of said first and second wafer alignment patterns projected on said mask through said projection lens are aligned with the longitudinal center axes of said first and second mask alignment patterns, respectively, disposing the wafer in said predetermined region;

projecting a light through said mask and said projection lens onto said wafer thereby forming optical images of said first and second mask alignment patterns on said wafer;

producing electrical signals representative of positional relationships between said first wafer alignment pattern and said first mask alignment pattern and that bewteen said second wafer alignment pattern and said second mask alignment pattern; and adjusting the position of said wafer relative to the position of said mask so as to change said electrical signals towards predetermined conditions which exist when the longitudinal center axes of said first and second mask alignment patterns are aligned with each other, respectively, wherein, during the course of said adjusting, equal aamounts of said projected light will be reflected off the first and second step edges of each of said first and second wafer alignment patterns due to the positional relationship of the longitudinal center axes of the first and second wafer alignment patterns to the optical axis of the projection lens.

3. A mask alignment method of projection type according to claim 2 wherein said first and second wafer alignment patterns comprise a line pattern, respectively.

4. A mask alignment method of projection type according to claim 1 or 2, wherein said first and second mask alignment patterns comprise a square pattern, respectively.

5. A mask alignment method of projection type according to claim 1 or 2, wherein a reduction-projection lens is used as said projection lens.

6. A mask alignment apparatus of projection type comprising:

a wafer-feeding table for carrying a wafer, said wafer being provided with wafer alignment patterns formed in at least two portions on said wafer, said wafer alignment patterns including line segments, respectively, said line segments being arranged radially with respect to the optical axis of a projection lens, the perpendicular from one of said wafer alignment patterns to said optical axis making an angle approximately equal to 90° with respect to the perpendicular from the other wafer alignment pattern to said optical axis, wherein each of said line segments includes first and second step edges extending parallel to one another along the length of said line segment;

a mask-feeding table disposed above said wafer-feeding table for carrying a mask, said mask being provided with mask alignment patterns formed in at least two portions on said mask and with a circuit pattern formed on said mask, said mask alignment patterns including line segments, respectively, the positions of said mask alignment patterns optically corresponding to the positions of said wafer alignment patterns through said projection lens, respectively;

said projection lens being disposed between said wafer-feeding table and said mask-feeding table for projecting said patterns formed on said mask onto said wafer;

a plurality of units for scanning and detecting each of at least two optical images of said alignment patterns, one of said optical images corresponding to said first wafer alignment pattern and said first mask alignment pattern, the other optical image corresponding to said second wafer alignment pattern and said second mask alignment pattern, said optical images being converted into video signals by image pickup devices incorporated in said units;

means for causing said wafer-feeding table to conduct step and repeat movements in accordance with a pitch of chips contained in said wafer; and displacement detecting means for detecting the relative displacement in the directions of X and Y axes between said wafer and said mask on the basis of said video signals delivered from said image pickup devices, said relative displacement being detected for at least three alignment patterns by operating said means for causing said wafer-feeding table to conduct step and repeat movements, said mask-feeding table and said wafer-feeding table being relatively moved on the basis of said relative displacement detected by said displacement detecting means to align said wafer and said mask with each other, wherein, during the course of said adjusting, equal amounts of said projected light will be reflected off the first and second step edges of each of said wafer alignment patterns due to the positional relationship of the longitudinal center axes of the wafer alignment patterns to the optical axis of the projection lens.

7. A mask alignment apparatus of projection type according to claim 6, wherein each of said units for scanning and detecting said optical images includes a scanning plate which is provided with a slit, is supported by a flat spring, and conducts the reciprocating motion, and said image pickup device for detecting the optical image passing through said slit.

* * * * *